(12) United States Patent
Lin et al.

(10) Patent No.: US 8,797,454 B2
(45) Date of Patent: Aug. 5, 2014

(54) MONITORING DEVICE WITH INDEPENDENT HEAT DISSIPATION FOR IMAGE CAPTURE COMPONENT

(75) Inventors: Chien Shun Lin, New Taipei (TW); Pei Feng Tseng, New Taipei (TW)

(73) Assignee: Moxa Inc., New Taipei (TW)

( * ) Notice: Subject to any disclaimer, the term of this patent is extended or adjusted under 35 U.S.C. 154(b) by 0 days.

(21) Appl. No.: 13/451,562

(22) Filed: Apr. 20, 2012

(65) Prior Publication Data

US 2013/0278820 A1  Oct. 24, 2013

(51) Int. Cl.
*H04N 5/225*  (2006.01)
*H04N 5/228*  (2006.01)

(52) U.S. Cl.
USPC .................... 348/374; 348/208.4; 348/208.7

(58) Field of Classification Search
USPC ......................................................... 348/244
See application file for complete search history.

(56) References Cited

U.S. PATENT DOCUMENTS 7,961,220 B2 * 6/2011 Orihashi et al. ........... 348/208.4

\* cited by examiner

*Primary Examiner* — Twyler Haskins
*Assistant Examiner* — Padma Haliyur
(74) *Attorney, Agent, or Firm* — Chih Feng Yeh; Huntington IP Consulting Co., Ltd.

(57) ABSTRACT

A monitoring device with independent heat dissipation for an image capture component is provided. A body module and an image capture module are designed separately. Thus, the image capture component in the image module and the processing circuit board in the body module can dissipate heat separately. The device achieves the goal of improving the image capture component and the processing circuit board in capturing high quality images.

9 Claims, 6 Drawing Sheets

MONITORING DEVICE WITH INDEPENDENT HEAT DISSIPATION FOR IMAGE CAPTURE COMPONENT

TECHNICAL BACKGROUND

1. Technical Field

This disclosure relates to a monitoring device and, in particular, to a monitoring device with independent heat dissipation for an image capture component.

2. Related Art

To protect citizen safety and situations in various administrative areas, governments often provide monitoring devices on streets, stores, banks, and buildings. Besides preventing criminals, they can also capture the images of them for the police to use later on. Such devices help preventing people's properties from possible loss.

A conventional monitoring device has an image capture component at the front end surface of its case. The rear end surface thereof is opened with several heat dissipating holes to lower the temperature inside the case by air circulation, preventing the interior processor and circuit board from being burnt. However, dusts and raindrops may also get into the monitoring device via those heat dissipating holes as well. This can greatly reduce the lifetime of the monitoring device.

To solve the above-mentioned problem, a monitoring device is proposed to have an image capture hole only on the front end surface of the case. The rear part of the case is made of a heat dissipating material in a closed shape. The circuit board thereof is locked with a heat conducting board, the side of which is provided with fins that can tightly attach to the inner wall of the rear part of the case. With such a design, the interior of the monitoring device is free from dusts and raindrops. Using the heat conducting board to transfer heat on the processor and the circuit board to the case achieves the goals of separating the circuit board from the exterior and rapid heat dissipation. Nevertheless, the contact area between the fins and the inner wall of the rear part of the case is small, limiting the heat dissipation effect.

Moreover, monitoring devices have a temperature limit between 50° C. and 60° C. under the condition of no fan. As the environmental temperature increases, noises in the images start to show up. Once the temperature reaches a limit, the entire monitoring device stops functioning. Existing monitoring devices have both the image capture component and the processing component in the same case. In this case, the heat produced by both the image capture component and the processing component has to be dissipated by the same case. However, the image capture component is very sensitive to temperature. If the image capture component does not have good heat dissipation in time, the image quality will drop significantly.

In summary, the prior art always has the problem of simultaneously dissipating heat produced by the image capture component and the processing component via the case. A consequence is that the heat dissipation efficiency of the image capture component drops under the influence of the processing component. The captured image quality is thus also worse. It is therefore imperative to provide an improved device.

SUMMARY

In view of the foregoing, the invention provides a monitoring device with independent heat dissipation for the image capture component.

The disclosed monitoring device with independent heat dissipation for the image capture component includes a body module and an image capture module. The body module further includes a processing circuit board and a body case. The image capture component includes an image capture component, a heat dissipating base, a heat dissipating mask, and an optical lens.

The processing circuit board of the body module is used to receive images and process the images. The body case has a body accommodating space, in which the processing circuit board is disposed for heat dissipation.

The image capture component of the image capture module is used to capture images. The heat dissipating base of the image capture component has a first surface and a second surface opposite to each other. The first surface has an accommodating space in which the image capture component is fixed. The second surface has several fins for heat dissipation of the image capture component. The heat dissipating base has a through groove going through the first surface and the second surface. The image capture component electrically connects to the processing circuit board via the through groove to provide images. The heat dissipating mask of the image capture module has an engaging part, a fixing part, a lens opening, and a lens fixing part. The engaging part extends from both ends of the heat dissipating part for fixing the heat dissipating base on the heat dissipating mask. When the heat dissipating base is fixed on the heat dissipating mask, the center of the image capture component and the center of the lens opening are on same axial line. The heat dissipating mask is attached to the image capture component for dissipating heat produced by the image capture component. The image capture module is fixed onto the body case of the body module via the fixing part. A heat dissipating space is formed between the image capture module and the body module. The optical lens of the image capture module is fixed on the lens fixing part.

As described above, the invention differs from the prior art in that the invention separates the body module and the image capture module. The body module dissipates the heat of the processing circuit board via the body case. The heat produced by the image capture component is carried away by the heat dissipating base and the heat dissipating mask simultaneously. When the body module and the image capture module are combined together, there is a heat dissipating space formed in between for the fins on the heat dissipating base to have better heat dissipation. The image capture component thus has independent heat dissipation for better image quality.

With the above-mentioned technique, the invention achieves the goal of independent heat dissipation for the image capture component and the processing circuit board. This can enhance the heat dissipation effect for the image capture component and the processing circuit, thereby rendering better image quality.

BRIEF DESCRIPTION OF THE DRAWINGS

The invention will become more fully understood from the detailed description given herein below illustration only, and thus is not limitative of the present invention, and wherein.

DETAILED DESCRIPTION

The present invention will be apparent from the following detailed description, which proceeds with reference to the accompanying drawings, wherein the same references relate to the same elements.

Figure 1:
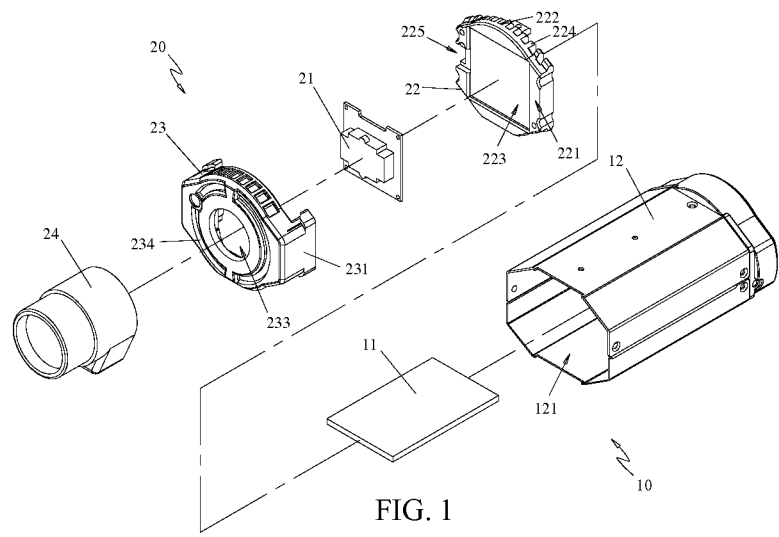
FIG. 1 is a three-dimensional exploded view of the disclosed monitoring device with independent heat dissipation for an image capture component.

We first describe the monitoring device with independent heat dissipation for an image capture component according to the invention. FIG. 1 is a three-dimensional exploded view of the disclosed monitoring device with independent heat dissipation for an image capture component.

The disclosed monitoring device with independent heat dissipation for an image capture component includes: a body module 10 and an image capture module 20. The body module 10 further includes: a processing circuit board 11 and a body case 12. The image capture module 20 includes: an image capture component 21, a heat dissipating base 22, a heat dissipating mask 23, and an optical lens 24.

The processing circuit board 11 of the body module 10 receives images from the image capture component 21 of the image capture module 20 and processes the images. The processed images are provided for subsequent processing. The processing circuit board 11 is disposed inside the body case 12 of the body module 10. The body case 12 has a body accommodating space 121 for accommodating the processing circuit board 11. The processing circuit board 11 is fixed in the body accommodating space 12 of the body case 12 via screws. The body case 12 is made of a metal with high thermal conductivity (e.g., aluminum alloy, iron alloy, etc.). Thus, the heat produced by the chip on the processing circuit board 11 can be carried away and dissipated via the body case 12.

Figure 2:
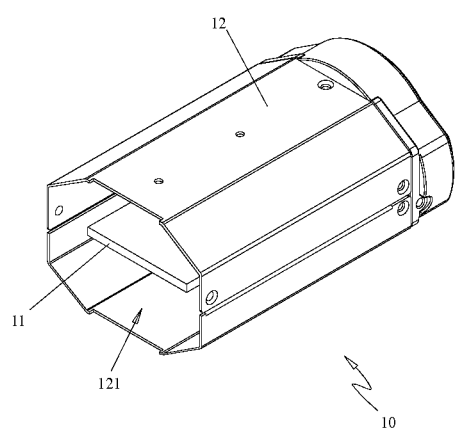
FIG. 2 is a three-dimensional assembly view of the body module in the disclosed monitoring device with independent heat dissipation for an image capture component.

The body module composed by disposing the processing circuit board 11 in the body accommodating space 121 of the body case 12 is shown in FIG. 2. FIG. 2 is a three-dimensional assembly view of the disclosed monitoring device with independent heat dissipation for an image capture component.

Figure 3:
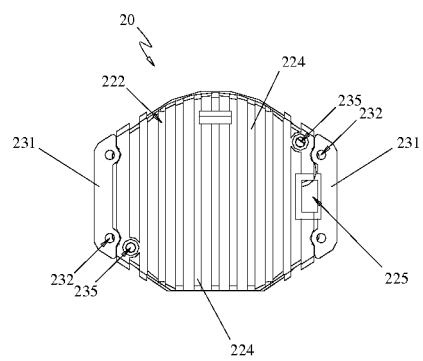
FIG. 3 is a rear view of the image capture module in the disclosed monitoring device with independent heat dissipation for an image capture component.

Please refer simultaneously to FIGS. 1 and 3. FIG. 3 is a rear view of the disclosed monitoring device with independent heat dissipation for an image capture component.

The image capture component 21 of the image capture module 20 is used to capture images. The image capture component 21 can be CCD or CMOS, which is only an example and should not be used to limit the scope of the invention. The images captured by the image capture component 21 are provided to the processing circuit board 11 of the body module 10 for image processing.

Afterwards, the heat dissipating base 22 of the image capture module 20 has a first surface 221 and a second surface 222, which are opposite to each other. That is, when the first surface 221 of the heat dissipating base 22 is the front surface, the second surface 222 is the back surface.

The first surface 221 of the heat dissipating base 22 has an accommodating space 223. The image capture component 21 of the image capture module 20 can be fixed in the accommodating space 223 on the first surface 221 by engaging or screwing. The second surface 222 of the heat dissipating base 22 has a plurality of fins 224. The heat dissipating base 22 is cast from a metal with high thermal conductivity (e.g., aluminum alloy, iron alloy, etc.). During the production process of the heat dissipating base 22, the accommodating space 223 is directly formed on the first surface 221 and the fins 224 are directly formed on the second surface 222. The image capture component 21 inside the accommodating space 223 can thus transfer the heat thereof to the fins 224 on the second surface 222 for heat dissipation.

One of the two ends of the heat dissipating base 22 has a through groove 225 that goes through the first surface 221 and the second surface 222 of the heat dissipating base 22. The through groove 225 provides a channel for the image capture component 21 of the image capture module 20 to electrically connect to the processing circuit board 11 of the body module 10. Thus, the images captured by the image capture component 21 are sent to the processing circuit board 11 of the body module 10 for image processing.

The heat dissipating mask 23 of the image capture module 20 has an engaging part 231, a fixing part 232, a lens opening 233, and a lens fixing part 234. The engaging part 231 extends from both ends of the heat dissipating mask 23. The heat dissipating base 22 is fixed onto the heat dissipating mask 23 via the engaging part 231.

It should be noted that when the heat dissipating base 22 is fixed to the heat dissipating mask 23 via the engaging part 231, the center of the image capture component 21 and the center of the lens opening 233 are on the same axial line. This prevents the images captured by the image capture component 21 from being affected by the lens opening 233.

The heat dissipating mask 23 is also cast from a metal with high thermal conductivity (e.g., aluminum alloy, iron alloy, etc.). During the production process of the heat dissipating base 22, the engaging part 231, the fixing part 232, the lens opening 233, and the lens fixing part 234 can be directly formed. When the heat dissipating base 22 is engaged and fixed to the heat dissipating mask 23 via the engaging part 231, the heat dissipating mask 23 is also attached to the image capture component 21. In addition to conducting and dissipating heat via the heat dissipating base 22, the image capture component 21 further dissipate heat via the heat dissipating mask 23. Thus the image capture component 21 has better heat dissipation.

Besides, the engaging part 231 can further include a screwing part 235 so that the heat dissipating base 22 can be fixed onto the heat dissipating mask 23 by engaging and screwing at the same time. This provides a fixing force for the heat dissipating base 22 to stay on the heat dissipating mask 23. This prevents the heat dissipating base 22 from possible displacement or rotation due to fatigue in the engaging structure that can result in misalignment between the center of the image capture component 21 and the center of the lens opening 233. Otherwise, the images captured by the image capture component 21 may be affected by the lens opening 233.

The optical lens 24 of the image capture module 20 is fixed on the lens fixing part 234 of the heat dissipating mask 23 by screwing or engaging. The optical lens 24 provides the image capture component 21 functions of wide-angle, zooming, and other effects.

Figure 4:
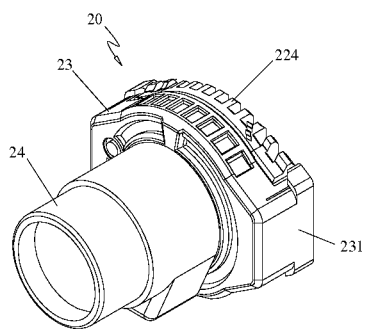
FIG. 4 is a three-dimensional assembly view of the image capture module in the disclosed monitoring device with independent heat dissipation for an image capture component.

The image capture module 20 after assembling the image capture component 21, the heat dissipating base 22, the heat dissipating mask 23, and the optical lens 24 is shown in FIG. 4. FIG. 4 is a three-dimensional assembly view of the image capture module in the disclosed monitoring device with independent heat dissipation for an image capture component.

Figure 5:
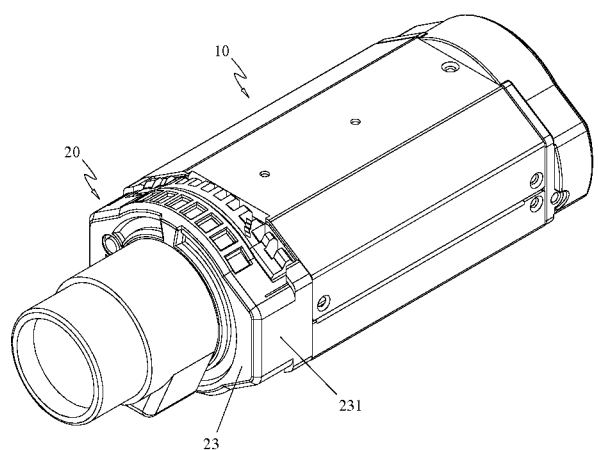
FIG. 5 is a three-dimensional assembly view of the disclosed monitoring device with independent heat dissipation for an image capture component.
Figure 6:
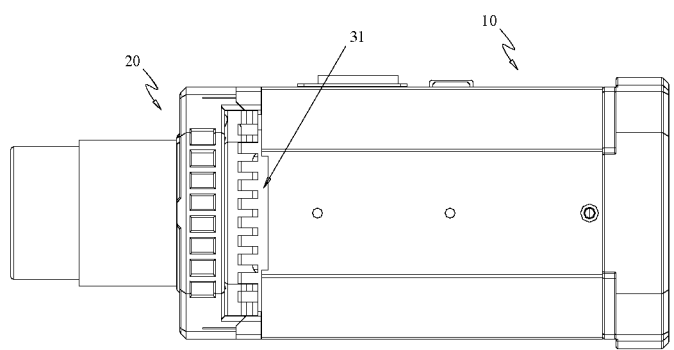
FIG. 6 is a planar view of the disclosed monitoring device with independent heat dissipation for an image capture component.

Please refer to FIGS. 5 and 6. FIG. 5 is a three-dimensional assembly view of the disclosed monitoring device with independent heat dissipation for an image capture component. FIG. 6 is a planar view of the disclosed monitoring device with independent heat dissipation for an image capture component.

The body module 10 and the image capture module 20 are fixed by screws via the fixing part 232 of the heat dissipating mask 23. The assembled body module 10 and image capture module 20 are shown in FIG. 5.

It should be noted that a heat dissipating space 31 is formed between the body module 10 and the image capture module 20. That is, the body module 10 and the image capture module 20 are not in close contact after assembly. The heat dissipating space 31 formed between the body module 10 and the image capture module 20 can enhance heat dissipation for the fins 224 on the second surface 222 of the heat dissipating base 22, thereby improving heat dissipation for the image capture component 21. The heat dissipating space 31 is shown in FIG. 5.

In summary, the invention differs from the prior art in that the invention employs the design of separate body module and image capture module. The body module uses the body case to dissipate heat from the processing circuit board. The image capture module uses the heat dissipating base and the heat dissipating mask to dissipate heat from the image capture component. When the body module and the image capture module are combined, there is a heat dissipating space formed in between, providing better heat dissipation for the fins on the heat dissipating base. Due to better and independent heat dissipation, the image capture component can obtain better image quality.

Using the disclosed technique can solve the problem in the prior art that both the image capture component and the processing component dissipate heat via the case at the same time. The heat dissipation efficiency of the image capture component is reduced due to the processing component. The prior art thus cannot obtain good image quality. The invention achieves the goal of independent heat dissipation for the image capture component and the processing circuit board. Such independent and improved heat dissipation for the image capture component and the processing circuit board significantly improves the captured image quality.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A monitoring device with independent heat dissipation for an image capture component, comprising:
a body module, which further includes:
a processing circuit board for receiving an image and processing the image; and
a body case for heat dissipation of the processing circuit and having a body accommodating space in which the processing circuit board is disposed inside of the body module; and
an image capture module, which is fixed on outside of the body module to form a heat dissipating space between the body module and the image capture module, further includes:
an image capture component for capturing the image;
a heat dissipating base having a first surface and a second surface opposite to each other, wherein the first surface is formed with an accommodating space for fixing the image capture component therein, the second surface has a plurality of fins for dissipating heat from the image capture component to the heat dissipating space for natural convection, and the heat dissipating base has a through groove going through the first surface and the second surface for the image capture component to electrically connect to the processing circuit board and providing the image to the processing circuit board;
a heat dissipating mask having an engaging part, a fixing part, a lens opening, and a lens fixing part, wherein the engaging part extends from both ends of the heat dissipating mask for fixing the heat dissipating base onto the heat dissipating mask, the center of the image capture component and the center of the lens opening are on a same axial line when the heat dissipating base is fixed on the heat dissipating mask, the heat dissipating mask and the image capture component are in direct contact for heat dissipation of the image capture component, and the image capture module is fixed on the body case of the body module via the fixing part to form the heat dissipating space between the heat dissipating base of the image capture module and the body case of the body module for natural convection; and
an optical lens fixed on the lens fixing part.

2. The monitoring device with independent heat dissipation for an image capture component of claim 1, wherein the body case is made of a metal with high thermal conductivity.

3. The monitoring device with independent heat dissipation for an image capture component of claim 1, wherein the heat dissipating base is made of a metal with high thermal conductivity.

4. The monitoring device with independent heat dissipation for an image capture component of claim 1, wherein the heat dissipating base is made by cast.

5. The monitoring device with independent heat dissipation for an image capture component of claim 1, wherein the heat dissipating mask is made of a metal with high thermal conductivity.

6. The monitoring device with independent heat dissipation for an image capture component of claim 1, wherein the heat dissipating mask is made by cast.

7. The monitoring device with independent heat dissipation for an image capture component of claim 1, wherein the engaging part further includes a screwing part for the heat dissipating base to be fixed on the heat dissipating mask by engaging and screwing.

8. The monitoring device with independent heat dissipation for an image capture component of claim 1, wherein the image capture module is fixed onto the body case of the body module via the fixing part by screwing.

9. The monitoring device with independent heat dissipation for an image capture component of claim 1, wherein the image capture component electrically connects to the processing circuit board via a bus line through the through groove, and the image capture component provides the image to the processing circuit board.

* * * * *